United States Patent
Bielmeier et al.

(12)

(10) Patent No.: US 10,802,091 B2
(45) Date of Patent: Oct. 13, 2020

(54) MONITORING AN ABSORPTION RATE OF INDUCTIVELY COUPLED COILS

(71) Applicants: Wolfgang Bielmeier, Erlangen (DE); Gerhard Brinker, Erlangen (DE); Jürgen Nistler, Erlangen (DE); Volker Schnetter, Nuremberg (DE)

(72) Inventors: Wolfgang Bielmeier, Erlangen (DE); Gerhard Brinker, Erlangen (DE); Jürgen Nistler, Erlangen (DE); Volker Schnetter, Nuremberg (DE)

(73) Assignee: Siemens Healthcare GmbH, Erlangen (DE)

(*) Notice: Subject to any disclaimer, the term of this patent is extended or adjusted under 35 U.S.C. 154(b) by 747 days.

(21) Appl. No.: 15/602,492

(22) Filed: May 23, 2017

(65) Prior Publication Data
US 2017/0343624 A1 Nov. 30, 2017

(30) Foreign Application Priority Data
May 25, 2016 (DE) ........................ 10 2016 209 088

(51) Int. Cl.
| G01R 33/28 | (2006.01) |
| G01R 33/36 | (2006.01) |
| G01R 33/48 | (2006.01) |
| G01R 33/24 | (2006.01) |
| G01R 33/34 | (2006.01) |

(52) U.S. Cl.
CPC ....... *G01R 33/288* (2013.01); *G01R 33/3642* (2013.01); *G01R 33/48* (2013.01); *G01R 33/246* (2013.01); *G01R 33/34076* (2013.01)

(58) Field of Classification Search
CPC ... G01R 33/288; G01R 33/3642; G01R 33/48
USPC ......................... 324/300–322; 600/407–435
See application file for complete search history.

(56) References Cited

U.S. PATENT DOCUMENTS

| 2007/0241753 A1* | 10/2007 | Sodickson | ........... A61B 5/0536 324/307 |
| 2007/0247155 A1* | 10/2007 | Zhu | ...................... G01R 33/288 324/318 |
| 2008/0157765 A1* | 7/2008 | Fontius | .............. G01R 33/3415 324/309 |

(Continued)

OTHER PUBLICATIONS

German Office Action for related German Application No. 10 2016 209 088.7 dated Mar. 2, 2017, with English Translation.

(Continued)

*Primary Examiner* — Dixomara Vargas
(74) *Attorney, Agent, or Firm* — Lempia Summerfield Katz LLC

(57) ABSTRACT

The disclosure relates to a method for monitoring an absorption rate when using a primary coil of a magnetic resonance device and a secondary coil inductively coupled to the primary coil and to a monitoring unit, a magnetic resonance device and a computer program product. According to the method a maximum admissible absorption rate is provided, using which a maximum admissible B1 field strength of the secondary coil is determined. Furthermore, an actual B1 field strength of the secondary coil is determined. The absorption rate is monitored using the actual B1 field strength of the secondary coil and the maximum admissible B1 field strength of the secondary coil.

15 Claims, 3 Drawing Sheets

(56) References Cited

U.S. PATENT DOCUMENTS

| | | | |
|---|---|---|---|
| 2009/0108844 A1* | 4/2009 | Sodickson | A61B 5/0536 324/309 |
| 2010/0013477 A1* | 1/2010 | Morrell | G01R 33/4833 324/309 |
| 2010/0076298 A1* | 3/2010 | Gross | A61B 5/055 600/411 |
| 2011/0118587 A1* | 5/2011 | Roemer | G01R 33/022 600/411 |
| 2011/0148411 A1* | 6/2011 | Bottomley | G01R 33/288 324/309 |
| 2011/0152670 A1* | 6/2011 | Yang | A61B 5/415 600/420 |
| 2012/0013337 A1* | 1/2012 | Graesslin | G01R 33/3415 324/309 |
| 2015/0002149 A1 | 1/2015 | Nehrke et al. | |
| 2015/0038831 A1* | 2/2015 | Yang | A61B 5/415 600/421 |
| 2015/0226821 A1* | 8/2015 | Zhang | G01R 33/4816 324/309 |
| 2015/0316626 A1* | 11/2015 | Thornton | G01R 33/288 702/19 |
| 2016/0091583 A1* | 3/2016 | Saybasili | A61B 5/7217 600/411 |
| 2017/0003364 A1* | 1/2017 | Harvey | G01R 33/4816 |

OTHER PUBLICATIONS

Wang W. et al; "Inductive Coupled Local TX Coil Design"; in Proc. Intl. Soc. Mag. Reson. Med; vol. 18, p. 1510; 2010; Siemens Medical Solutions Magentic Resonanace, Erlangen; p. 1; URL: http://www.medical.siemens.com/siemens/en_INT/gg_mr_FBAs/files/MAGNETOM_World/ismrm_proceedings/ismrm_2010/1510.pdf; 2009.

* cited by examiner

MONITORING AN ABSORPTION RATE OF INDUCTIVELY COUPLED COILS

The application claims the benefit of German Patent Application No. DE 10 2016 209 088.7, filed May 25, 2016, incorporated by reference in its entirety.

TECHNICAL FIELD

The disclosure relates to a method for monitoring an absorption rate when using a primary coil of a magnetic resonance device and a secondary coil, to a monitoring unit, to a magnetic resonance device, and to a computer program product.

BACKGROUND

Magnetic Resonance Imaging (MRI) is a known technique for generating images of the inside of the body of an examination object, which is based on the physical phenomenon of magnetic resonance (MR). For this purpose, fast-switched gradient pulses may be overlaid on a static main magnetic field B0 during a magnetic resonance examination in a magnetic resonance device. It is possible to trigger magnetic resonance signals by irradiating a high-frequency (HF) magnetic alternating field B1, (e.g., in the form of HF pulses), into the examination object. The energy of the HF pulses absorbed per unit of time and per kilogram body weight may be called the Specific Absorption Rate (SAR). The absorption of HF energy may lead to heating of the body tissue. Burns may occur with inadmissibly high local concentration of HF energy. The stress on thermoregulation or the cardiovascular system of the patient is significant with uniform distribution of the HF energy over the entire body.

The magnetic resonance device may have a body coil, (e.g., a whole body coil), with which the HF pulses may be generated. A further possibility consists in that at least one additional coil is used for transmitting the HF pulses, and this is inductively coupled to the body coil. Further details on inductively coupled coils are described in particular in "Inductive Coupled Local TX Coil Design", W. Wang et al, Proc. Intl. Soc. Mag. Reson. Med 18 (2010): 1510.

SUMMARY AND DESCRIPTION

The scope of the present disclosure is defined solely by the appended claims and is not affected to any degree by the statements within this description. The present embodiments may obviate one or more of the drawbacks or limitations in the related art.

The disclosure is based on the object of disclosing a simple and efficient method for monitoring an absorption rate of inductively coupled coils, in particular transmitting coils.

A proposed method is described for monitoring an absorption rate using a primary coil of a magnetic resonance device and a secondary coil inductively coupled to the primary coil. The method includes providing a maximum admissible absorption rate and determining an actual B1 field strength of the secondary coil. The absorption rate is monitored using the actual B1 field strength of the secondary coil and the maximum admissible absorption rate.

The absorption rate may be monitored significantly more accurately than previously by determining the actual B1 field strength of the secondary coil. Unnecessary output losses, which would entail, for example, a conservative limitation of the transmission power of the primary coil in certain methods, may be avoided.

The primary coil may be taken to refer to a body coil, in particular a whole body coil. The body coil may be permanently installed in the magnetic resonance device. The body coil may be configured to work as a transmitting and receiving coil, wherein within the scope of the disclosure described here, it is primarily its function as a transmitting coil that is of importance here.

The secondary coil, which is inductively coupled to the primary coil, may be designed as a small birdcage coil. By way of the inductive coupling, energy may be transmitted from the primary coil to the secondary coil which the secondary coil may release again in the form of high-frequency excitation pulses. It thereby is possible, in particular, to excite locally targeted magnetic resonance signals. The secondary coil may therefore also be understood as a local transmitting coil.

The absorption rate may be the specific absorption rate, as has already been described in the introduction. The maximum admissible absorption rate may be described, for example, with one or more limit value(s), (e.g., SAR limit values), and be specified, for example, by standards and/or safety guidelines. The maximum admissible absorption rate may be stored, (e.g., electronically), in a database, so the maximum admissible absorption rate may be provided in that the maximum admissible absorption rate is read from the database and transmitted to a monitoring unit.

The currents created by induction in the secondary coil in turn generate a B1 field, which may have an increased field line density locally, in particular in the volume encompassed by the secondary coil, owing to typical geometric ratios of the primary coil compared to the secondary coil. The density of the field lines may be indicated with the aid of a B1 field strength.

The actual B1 field strength of the secondary coil may be determined and the absorption rate may be monitored using the actual B1 field strength of the secondary coil and the maximum admissible absorption rate during the magnetic resonance examination of the examination object and/or by the monitoring unit. For this purpose, the actual B1 field strength of the secondary coil may be continually determined during the magnetic resonance examination. If the maximum admissible absorption rate is exceeded, a countermeasure is advantageously initiated to prevent injury to the examination object.

A maximum admissible B1 field strength may be determined using the maximum admissible absorption rate. The maximum admissible B1 field strength may be a maximum physical B1 field strength. An actual physical B1 field strength may be ascertained, moreover, using the actual B1 field strength of the secondary coil.

A physical B1 field strength may be taken to refer to a B1 field strength active in the body of the patient. Monitoring of the absorption rate may include that the maximum admissible, in particular physical, B1 field strength is compared with the actual physical B1 field strength. This comparison is advantageously carried out continually during a magnetic resonance examination. The maximum admissible B1 field strength may be a field strength at which the maximum admissible absorption rate is just still observed.

One embodiment of the method provides that the absorption rate is monitored in respect of a plurality (e.g., large number) of load states of the secondary coil.

Loading of the secondary coil may depend, in particular, on the material encompassed by the volume in which the B1 field of the secondary coil may take effect. For example, a heavier patient may cause greater loading than a lighter patient because, as a rule, the heavier patient fills the secondary coil to a greater extent. Because the material may interact with the B1 field and the resulting absorption rate is therefore load-dependent, the maximum admissible, in particular physical, B1 field strength and/or the actual physical B1 field strength may be determined by way of a large number of possible loads, (e.g., all loads), on the secondary coil.

The maximum admissible, in particular physical, B1 field strength may be determined from the minimum B1 field strength in order to achieve the maximum admissible absorption rate. If, for example in load state A, a maximum admissible absorption rate of e.g. 1 W/kg SAR is achieved with a B1 field strength of 0.7 µT, and in load state B with 0.6 µT already, 0.6 µT results as the maximum admissible, in particular physical, B1 field strength. In order to achieve the maximum admissible absorption rate, the minimum B1 field strength may be determined over all possible load states by simulation calculations.

The maximum admissible, in particular physical, B1 field strength may be determined before a magnetic resonance examination of an examination object, in particular before an excitation of magnetic resonance signals by irradiation of HF pulses. The determined maximum admissible, in particular physical, B1 field strength may be dependent on the embodiment of the secondary coil. It is conceivable that the maximum admissible, in particular physical, B1 field strength is determined once, in particular specifically for the embodiment of the secondary coil. The determined maximum admissible, in particular physical, B1 field strength may be stored in a database, so it may be retrieved by the monitoring unit for monitoring of the absorption rate during a magnetic resonance examination.

One embodiment of the method provides that an actual B1 field strength of the primary coil is determined, wherein the actual B1 field strength of the secondary coil is determined using the actual B1 field strength of the primary coil. The actual B1 field strength of the primary coil may be determined during the magnetic resonance examination of the examination object.

The magnetic resonance device, in particular the primary coil, may include at least one B1 field sensor, e.g. at least one pickup coil, for determining the actual B1 field strength of the primary coil. A pickup current may be measured that is induced in the pickup coil by the actual B1 field.

The magnetic resonance device, in particular the secondary coil, advantageously does not have a measuring device for, in particular direct, determination of the actual B1 field strength of the secondary coil. This enables an inexpensive solution because possible additional scanning devices and/or data channels may be omitted in hardware and/or software.

The actual B1 field strength of the primary coil may be determined and/or limited using a transmission power, (e.g., a power loss), of the primary coil. The transmission power of the primary coil may be determined using a current measurement of a primary current of the primary coil, wherein the actual B1 field of the primary coil is generated by the primary current. The transmission power of the primary coil may be continually determined and/or limited during recording of the magnetic resonance signals. For example, the primary current may be permanently detected and/or averaged over time, e.g., with the aid of a digital signal processor.

For this purpose, the primary coil may have at least one power measuring device and/or current measuring device arranged, for example, on at least one transmitting cable of the primary coil. The absorbed power of the transmitting system may therefore be determined relatively easily from primary coil and secondary coil.

An adjustment scan may be carried out, using which a ratio of the actual B1 field strength of the primary coil to the transmission power of the primary coil is determined. The adjustment scan may take place before the magnetic resonance examination of the examination object, in particular before acquisition of scan data from which images of the examination object may be reconstructed. Using the ratio determined from the adjustment scan, the B1 field strength of the primary coil may be easily and precisely determined from the transmission power.

The actual B1 field strength of the secondary coil may be determined using the actual B1 field strength of the primary coil by a field coupling dependency. Because the field coupling of primary coil to secondary coil may be constant, (e.g., spatially and temporally), the B1 field strength of the secondary coil may therefore be effectively derived from the B1 field strength of the primary coil.

The field coupling dependency may be determined using a measurement. For this purpose, a B1 field strength measurement may be carried out using a measuring sequence provided for this, with which a B1 distribution may be determined, e.g., a B1 mapping is performed. Furthermore, a MR signal level is determined, e.g., a signal strength during a normal MR scan.

The B1 field strength and/or the MR signal level may be measured in the presence of the secondary coil. The field coupling of primary coil to secondary coil and/or the degree of coupling of the secondary coil to the primary coil may be determined therefrom.

The field coupling dependency may also be determined using a simulation.

A further embodiment provides that the actual B1 field strength of the secondary coil is determined using at least one B1 field sensor. This may occur continually throughout the recording of magnetic resonance signals. The at least one B1 field sensor, which may be designed as a small loop coil and/or pickup coil, may be arranged on the secondary coil.

The actual B1 field strength of the secondary coil may therefore occur independently of the primary coil, in particular independently of the actual B1 field strength of the secondary coil. Possible problems and/or inaccuracies connected therewith may therefore be avoided.

Furthermore, a monitoring unit is proposed that is designed to carry out a method for monitoring an absorption rate when using a primary coil of a magnetic resonance device and a secondary coil inductively coupled to the primary coil. The monitoring unit may include one or more processor(s) and/or a storage device.

The advantages of the device for monitoring an absorption rate when using a primary coil of a magnetic resonance device and a secondary coil inductively coupled to the primary coil, may match the advantages of the method for monitoring an absorption rate when using a primary coil of a magnetic resonance device and a secondary coil inductively coupled to the primary coil, and these have been stated above in detail. Features, advantages, or alternative embodiments mentioned in this connection may likewise be transferred to the other claimed subject matters and vice versa.

The monitoring unit may be designed, in particular, to be integrated in a magnetic resonance device and/or include a data interface designed to transmit data to a magnetic resonance device. It is also conceivable for the monitoring unit to work independently of a magnetic resonance device.

In addition, a magnetic resonance device having a monitoring unit is proposed that is designed to carry out a method for monitoring an absorption rate when using a primary coil of a magnetic resonance device and a secondary coil inductively coupled to the primary coil. The magnetic resonance device may include a system control unit for controlling the magnetic resonance device, which in turn includes the monitoring unit. The magnetic resonance device may include, moreover, the primary coil, (e.g., a permanently installed body coil), and/or the secondary coil, (e.g., a local coil). Furthermore, the magnetic resonance device may include at least one B1 field sensor for determining the actual B1 field strength of the secondary coil.

Furthermore, a computer program product is proposed that includes a program and may be loaded directly into a storage device of a programmable arithmetic unit of a monitoring unit and has program functions, (e.g., libraries and auxiliary functions), in order to carry out a method for checking at least one specified value for a magnetic resonance examination when the computer program product is run in the monitoring unit. The computer program product may include software having a source code, which still has to be compiled and linked or which just has to be interpreted, or an executable software code that just has to be loaded into the monitoring unit for execution. The method may be carried out quickly, robustly, and in a way that may be repeated in an identical manner by the computer program product. The computer program product is configured in such a way that it may carry out the method acts by the monitoring unit. The monitoring unit has the requirements in each case, (for example, an appropriate working memory, an appropriate graphics card, or an appropriate logic unit), so the respective method acts may be carried out efficiently.

The computer program product is stored, for example, on a computer-readable medium or on a network or server, from where the computer program product may be loaded into the processor of a local monitoring unit. Furthermore, control information of the computer program product may be stored on an electronically readable data carrier. The control information of the electronically readable data carrier may be configured in such a way that it carries out a method when the data carrier is used in a monitoring unit. Examples of electronically readable data carriers are a hard disc, a DVD, a magnetic tape or a USB stick, on which electronically readable control information, in particular software, is stored. The embodiments of the previously described methods may be carried out when this control information is read from the data carrier and stored in a monitoring unit. The disclosure may also start from the computer-readable medium and/or the electronically readable data carrier.

BRIEF DESCRIPTION OF THE DRAWINGS

Further advantages, features and details of the disclosure emerge from the exemplary embodiments described below and with reference to the drawings, in which.

DETAILED DESCRIPTION

Figure 1:
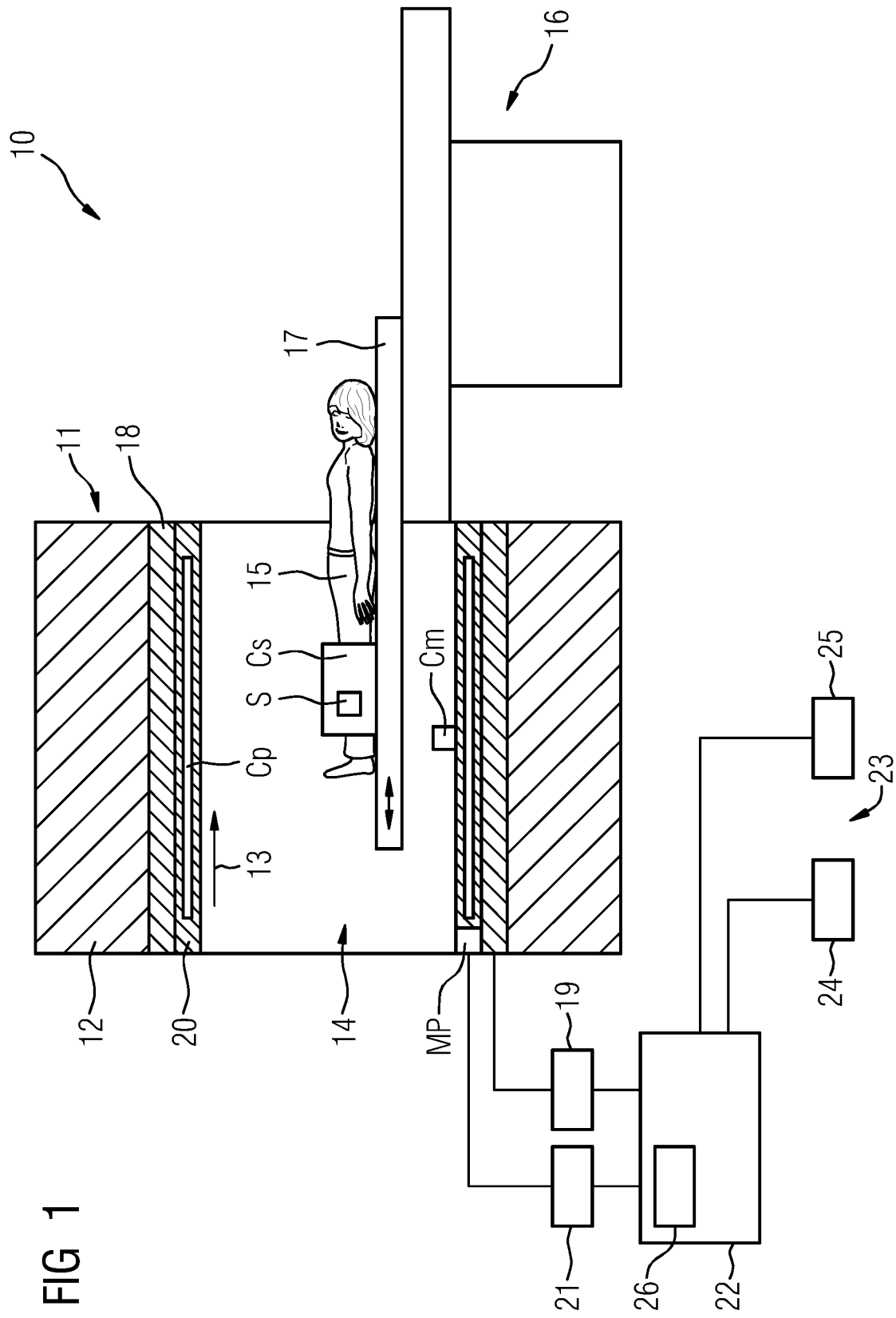
FIG. 1 depicts an exemplary magnetic resonance device in a schematic diagram.

FIG. 1 schematically depicts a magnetic resonance device 10. The magnetic resonance device 10 includes a magnetic unit 11 having, for example, a superconductive, main magnet 12 for generating a strong and, in particular, time-constant B0 main magnetic field 14. Furthermore, the magnetic resonance device 10 includes a patient recording region 14 for recording a patient 15. In the present exemplary embodiment, the patient recording region 14 is cylindrical and cylindrically surrounded in a circumferential direction by the magnetic unit 11. Basically, a design of the patient recording region 14 that differs herefrom is also conceivable. The patient 15 may be variably positioned in the patient recording region 14 by a patient positioning device 16 of the magnetic resonance device 10 depending on the examination region. The patient positioning device 16 has for this purpose a patient couch 17 designed so it may move inside the patient recording region 14.

The magnetic unit 11 also has a gradient coil unit 18 for generating magnetic field gradients used for spatial encoding during imaging. The gradient coil unit 18 is controlled by a gradient control unit 19 of the magnetic resonance device 10. The magnetic unit 11 also includes a high-frequency antenna unit 20, which in the present exemplary embodiment includes a body coil permanently integrated in the magnetic resonance device 10, hereinafter also called primary coil Cp. The high-frequency antenna unit 20 optionally includes a power measuring device MP for detecting a transmission power Pt of the primary coil Cp and/or a field sensor Cm for determining an actual B1 field strength B1p of the primary coil Cp.

Furthermore, the magnetic resonance device 10 includes a local coil whose position may be changed, hereinafter also called secondary coil Cs. The secondary coil Cs, which is arranged here on the leg of the patient 15, is inductively coupled to the primary coil Cs. The magnetic resonance device optionally includes a B1 field sensor S for determining an actual B1 field strength B1s of the secondary coil Cs.

The high-frequency antenna unit 20 is designed, in particular together with the secondary coil Cs, for excitation of nuclei that are established in the main magnetic field 13 generated by the main magnet 12. The high-frequency antenna unit 20 is controlled by a high-frequency antenna control unit 21 of the magnetic resonance device 10 and irradiates high-frequency magnetic resonance sequences, which may include a plurality of HF pulses, into an examination space that may be formed by a patient recording region 14 of the magnetic resonance device 10. The high-frequency antenna unit 20 is designed, moreover, for receiving magnetic resonance signals.

The magnetic resonance device 10 has a system control unit 22 for controlling the main magnet 12, the gradient control unit 19, and for controlling the high-frequency antenna control unit 21. The system control unit 22 centrally controls the magnetic resonance device 10, such as, for example, the execution of a predetermined imaging gradient echo sequence. The system control unit 22 includes, moreover, an evaluation unit (not shown) for evaluation of medical image data acquired during the magnetic resonance examination. The magnetic resonance device 10 includes, moreover, a user interface 23 connected to the system control unit 22. Control information, such as, for example, imaging parameters, and reconstructed magnetic resonance images, may be displayed on a display unit 24, (e.g., on at least one monitor), of the user interface 23 for a medical operator. The user interface 23 has, moreover, an input unit 25, by which the medical operator may input information and/or parameters during a scanning process.

The system control unit 22 includes, moreover, a monitoring unit 26 having an arithmetic unit, which has, for example, one or more processor(s) and/or a storage device for carrying out a method for monitoring an absorption rate when using the primary coil Cp and the secondary coil Cs. A program may be loaded into the storage device of the programmable arithmetic unit, having program functions, in order to carry out a method for monitoring an absorption rate when using the primary coil Cp and the secondary coil Cs when the program is run in the arithmetic unit.

In the present exemplary embodiment, the illustrated magnetic resonance device 10 may of course have further components that magnetic resonance devices conventionally have. A general mode of operation of a magnetic resonance device 10 is known to a person skilled in the art, moreover, so a detailed description of the general components will be omitted.

Figure 2:
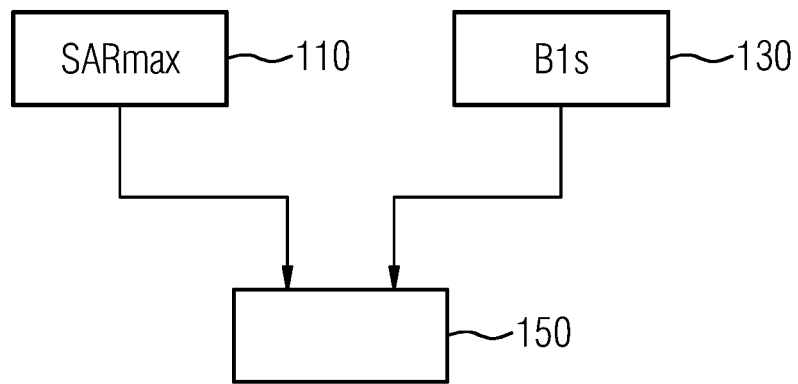
FIG. 2 depicts a block diagram of an exemplary method.

FIG. 2 depicts a block diagram an embodiment of a method for monitoring an absorption rate when using a primary coil Cp of a magnetic resonance device 10 and a secondary coil Cs inductively coupled to the primary coil Cp. A maximum admissible absorption rate SARmax is provided in act 110, for example by the monitoring unit 26 accessing a database in which the maximum admissible absorption rate SARmax is stored.

An actual B1 field strength B1s of the secondary coil Cs is determined in act 130, for example by the B1 field sensor S.

The absorption rate is monitored in act 150 using the actual B1 field strength B1s of the secondary coil Cs.

Figure 3:
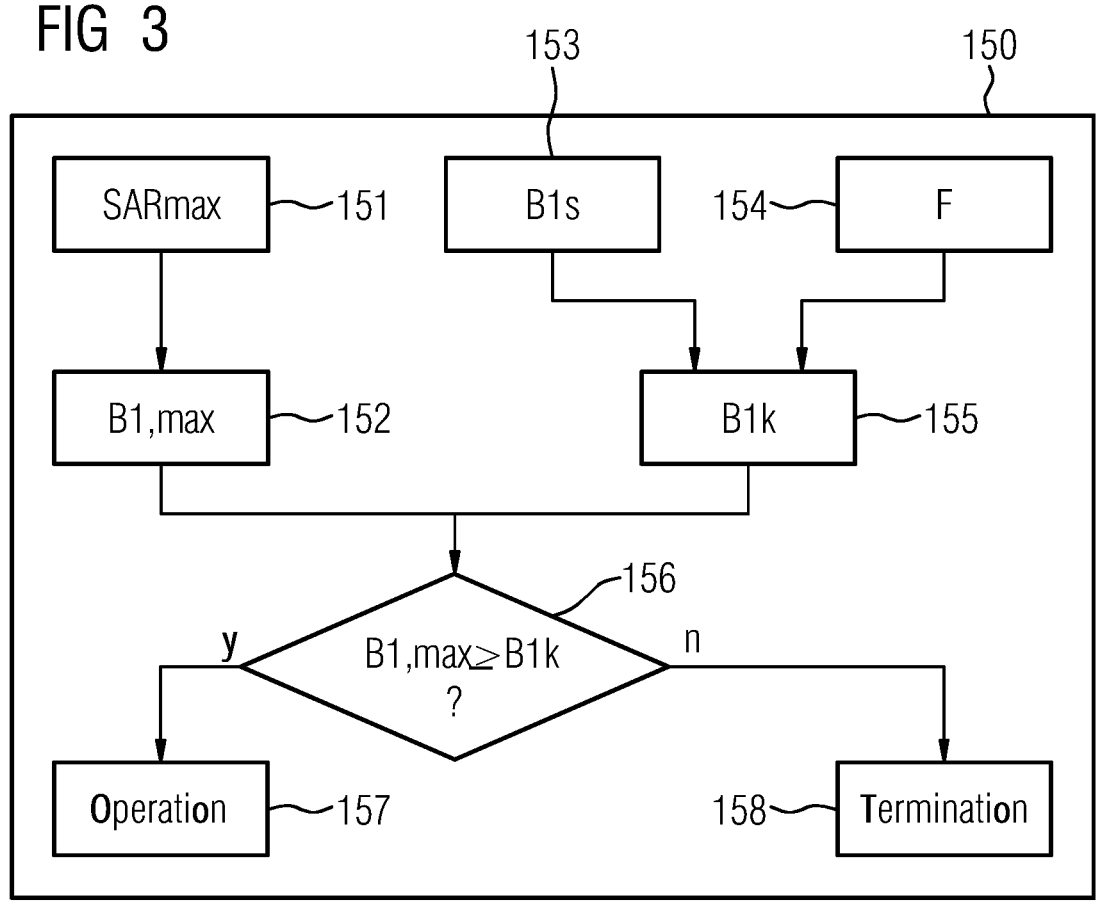
FIG. 3 depicts a block diagram of an act of the exemplary method with possible sub-acts.

FIG. 3 depicts one possible embodiment of monitoring in act 150. Using the maximum admissible absorption rate SARmax provided in act 151, a maximum admissible B1 field strength B1,max is determined in act 152. The maximum admissible B1 field strength B1,max is a physical B1 field strength, e.g., a B1 field strength active in the body of the patient 15.

The determined actual B1 field strength B1s is provided in act 153. A factor F is determined in act 154, using which an actual physical B1 field strength B1k is determined from the actual B1 field strength B1s in act 155. The factor F takes into account a plurality of, in particular all, load states of the secondary coil Cs. The actual physical B1 field strength B1k is compared with the maximum admissible, in particular physical, B1 field strength B1,max in act 156. As long as the actual physical B1 field strength B1k is lower than the maximum admissible, in particular physical, B1 field strength B1,max, the magnetic resonance device 10 is operated in act 157, otherwise a termination occurs in act 158.

Figure 4:
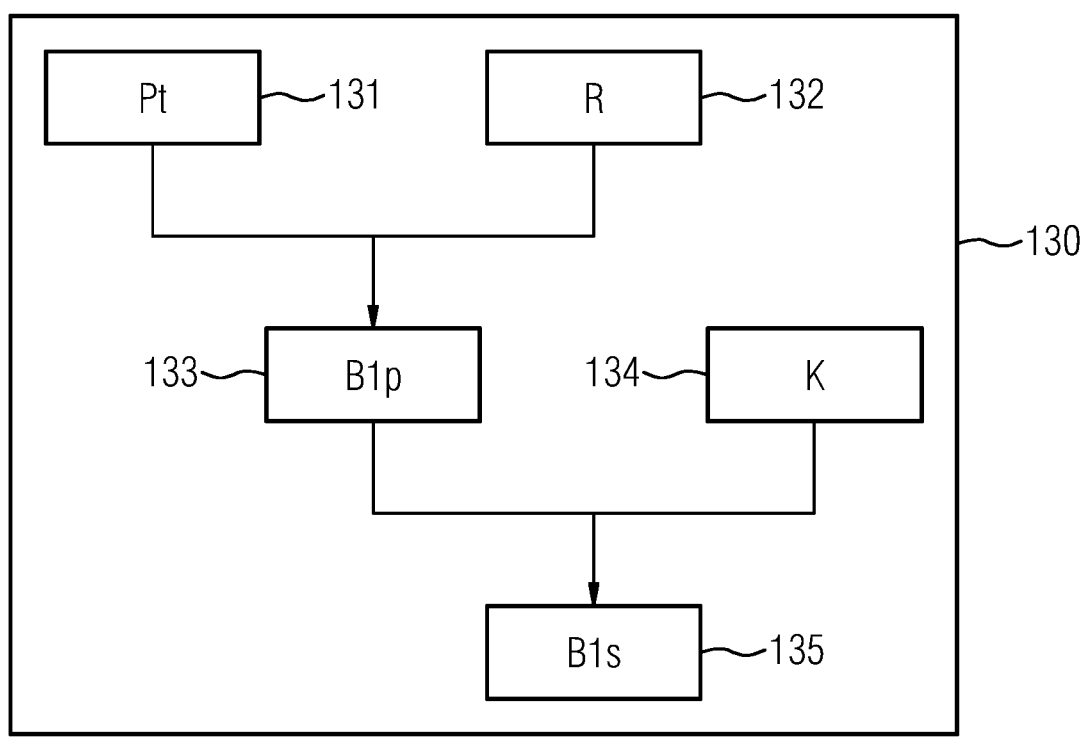
FIG. 4 depicts a block diagram of a further act of the exemplary method with possible sub-acts.

FIG. 4 illustrates an alternative and/or additional possibility for determining the actual B1 field strength B1s of the secondary coil Cs by the B1 field sensor S in act 130. Accordingly, an actual B1 field strength B1p of the primary coil Cp is determined in act 133, for example with the aid of the B1 field sensor Cm. Using the determined actual B1 field strength B1p of the primary coil Cp, the actual B1 field strength B1s of the secondary coil Cs is determined in act 135. Determination of the actual B1 field strength B1s of the secondary coil Cs may include a field coupling dependency K determined here in act 134, for example using a measurement and/or a simulation.

A transmission power Pt of the primary coil Cp may be detected, for example, with the power measuring device MP in order to determine the actual B1 field strength B1p of the primary coil Cp. A ratio R of the actual B1 field strength B1p of the primary coil Cp to the transmission power Pt of the primary coil Cp may be determined by an adjustment scan in act 132, which may be carried out, for example, before any recording of magnetic resonance data. The actual B1 field strength B1p may then be determined from the transmission power Pt and the ratio R. The acts illustrated in FIG. 4 therefore enable determination of the absorbed power in the inductively coupled secondary coil Cs by a standardization of the power measurement of the primary coil Cp by way of a B1 field measurement at this coil. Furthermore, the need for any additional measurement equipment, (e.g., a B1 field sensor S at the secondary coil Cs), may be dispensed with in this embodiment.

To conclude, reference is again made to the fact that the method described in detail above and the illustrated magnetic resonance device are only exemplary embodiments which a person skilled in the art may modify in a wide variety of ways without departing from the scope of the disclosure. Furthermore, use of the indefinite article "a" or "an" does not preclude the relevant features from also being present several times. Similarly, the term "unit" does not preclude the relevant components from including a plurality of interacting sub-components that may optionally also be spatially distributed.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for monitoring an absorption rate, the method comprising:
providing a maximum admissible absorption rate;
determining, by a processor of a system control unit of a magnetic resonance device, an actual B1 field strength of a primary coil of the magnetic resonance device;
determining an actual B1 field strength of a secondary coil of the magnetic resonance device using the actual B1 field strength of the primary coil, wherein the secondary coil is inductively coupled to the primary coil;
monitoring, by the processor, the absorption rate using the actual B1 field strength of the secondary coil and the maximum admissible absorption rate; and
adjusting or terminating operation of the magnetic resonance device when the absorption rate is greater than the maximum admissible absorption rate.

2. The method of 1, further comprising:
determining a maximum admissible B1 field strength using the maximum admissible absorption rate.

3. The method of claim 2, further comprising:
determining an actual physical B1 field strength using the actual B1 field strength of the secondary coil.

4. The method of claim 3, wherein the absorption rate is monitored in respect of a plurality of load states of the secondary coil.

5. The method of claim 1, further comprising:
determining an actual physical B1 field strength using the actual B1 field strength of the secondary coil.

6. The method of claim 1, wherein the absorption rate is monitored in respect of a plurality of load states of the secondary coil.

7. The method of claim 1, wherein the actual B1 field strength of the primary coil is determined using at least one B1 field sensor.

8. The method of claim 1, wherein the actual B1 field strength of the primary coil is limited using a transmission power of the primary coil.

9. The method of claim 8, further comprising:
carrying out an adjustment scan; and
determining a ratio of the actual B1 field strength of the primary coil to the transmission power of the primary coil using the adjustment scan.

10. The method of claim 1, wherein the actual B1 field strength of the secondary coil is determined using the actual B1 field strength of the primary coil by a field coupling dependency.

11. The method of claim 1, wherein the primary coil is a body coil and the secondary coil is local coil.

12. A monitoring unit of a magnetic resonance device, the monitoring unit comprising:
a programmable arithmetic unit having a storage device; and
a computer program product having a program configured to be loaded directly in the storage device of the programmable arithmetic unit of the monitoring unit, wherein when the program is run in the arithmetic unit of the monitoring unit, the monitoring unit is configured to:
provide a maximum admissible absorption rate;
determine an actual B1 field strength of a primary coil of the magnetic resonance device;
determine an actual B1 field strength of a secondary coil of the magnetic resonance device using the actual B1 field strength of the primary coil, wherein the secondary coil is inductively coupled to the primary coil;
monitor the absorption rate using the actual B1 field strength of the secondary coil and the maximum admissible absorption rate; and
adjust or terminate operation of the magnetic resonance device when the absorption rate is greater than the maximum admissible absorption rate.

13. A magnetic resonance device comprising:
a primary coil;
a secondary coil inductively coupled to the primary coil; and
a monitoring unit configured to:
provide a maximum admissible absorption rate;
determine an actual B1 field strength of the primary coil;
determine an actual B1 field strength of the secondary coil using the actual B1 field strength of the primary coil;
monitor the absorption rate using the actual B1 field strength of the secondary coil and the maximum admissible absorption rate; and
adjust or terminate operation of the magnetic resonance device when the absorption rate is greater than the maximum admissible absorption rate.

14. The magnetic resonance device of claim 13, further comprising:
at least one B1 field sensor configured to determine the actual B1 field strength of the primary coil.

15. The magnetic resonance device of claim 13, wherein the primary coil is a body coil and the secondary coil is local coil.

* * * * *